United States Patent

Shin et al.

[11] Patent Number: 6,022,779
[45] Date of Patent: Feb. 8, 2000

[54] METHOD OF FORMING MASK ROM

[75] Inventors: Bong-Jo Shin; Ki-Jik Lee, both of Chungcheongbuk-do, Rep. of Korea

[73] Assignee: LG Semicon Co., Ltd., Chungcheongbuk-do, Rep. of Korea

[21] Appl. No.: 09/083,106

[22] Filed: May 22, 1998

[30] Foreign Application Priority Data

May 23, 1997 [KR] Rep. of Korea ............... 97-20282

[51] Int. Cl.[7] ............................................. H01L 21/8234
[52] U.S. Cl. ........................ 438/275; 438/276; 438/278
[58] Field of Search .......................... 438/259, 268, 438/270, 275, 276, 277, 278, 289, 290, 291, 427, 297, 370, 423, 430, 549

[56] References Cited

U.S. PATENT DOCUMENTS

| | | | |
|---|---|---|---|
| 5,149,664 | 9/1992 | Shin et al. ............... | 438/277 |
| 5,429,973 | 7/1995 | Hong ....................... | 438/278 |
| 5,504,025 | 4/1996 | Fong-Chun et al. ..... | 438/278 |
| 5,554,550 | 9/1996 | Yang ....................... | 438/270 |
| 5,595,927 | 1/1997 | Chen et al. ............. | 438/278 |
| 5,627,091 | 5/1997 | Hong ....................... | 438/278 |
| 5,661,055 | 8/1997 | Hsu et al. ............... | 438/259 |
| 5,668,031 | 9/1997 | Hsue et al. ............. | 438/275 |
| 5,680,345 | 10/1997 | Hsu et al. ............... | 438/259 |
| 5,693,552 | 12/1997 | Hsu ......................... | 438/289 |
| 5,751,040 | 5/1998 | Chen et al. ............. | 257/332 |
| 5,763,925 | 6/1998 | Hsu ......................... | 257/390 |

OTHER PUBLICATIONS

Fujio Masuoka, et al, "An 80 ns 1 Mbit Mask ROM with a New Memory Cell," Journal of Solid–State Circuits, vol.sc.19.No. 5.Oct. 1984, pp. 651–657.

Primary Examiner—Charles Bowers
Assistant Examiner—Jack Chen

[57] ABSTRACT

A method of fabricating a mask ROM includes forming a trench on a first conductivity type semiconductor substrate, implanting a second conductivity type impurity ion in at least a surface portion of the semiconductor substrate where the trench is formed, forming an insulating oxide layer on a surface of the semiconductor substrate, including a surface of the trench, forming gate oxide layers of both sides of the trench, forming first and second gates on the gate oxide layers and forming a first conductivity type channel by implanting a first conductivity type impurity ion in one side of the trench. As such, the resulting mask ROM includes two transistors on either side of a trench having channels along the side walls of the trench. The resulting mask ROM has a reduced surface width, enhancing integration.

19 Claims, 5 Drawing Sheets

METHOD OF FORMING MASK ROM

BACKGROUND OF THE INVENTION

1. Field of the Invention

The present invention relates to a mask ROM and its fabrication method and, more particularly, to a mask ROM capable of continuously coding data by implanting ions, using a mask of a user during the fabricating process.

2. Discussion of Related Art

A ROM is a nonvolatile memory device in which stored data are not changed in a normal operation state. A ROM is classified according to the methods for storing data into the ROM. There are a mask read only memory (ROM), a programmable ROM (PROM), an electrically programmable ROM (EPROM) and an erasable and electrically programmable ROM (EEPROM).

The mask ROM is coded with its data, i.e., has its data stored in it, by using a specialized mask (representing particular required for a user) during the fabrication process. Data stored in a mask ROM is not able to be changed, rather it is only possible to read the data. A type of mask ROM causes a predetermined transistor have a status that differs from other transistors by implanting impurity ions, so that a datum is coded. That is, the mask ROM causes a predetermined transistor to have an OFF state by implanting impurity ions during fabrication. Transistors for which impurity ions are not implanted during fabrication have an ON state, and vice versa. Therefore, the data are coded.

As illustrated in FIG. 1, a conventional mask ROM has a buried oxide layer 19 which is perpendicular to a wordline of gate 23. A high concentration impurity region (not shown) made of a common source and drain region and used for a bit line is formed under the buried oxide layer 19, so that the word line is perpendicular to the bit line. Accordingly, the word line and the bit line intersect and form transistors. First and second transistor channels 27 and 29 are formed between the impurity regions under the buried oxide layer 19, overlapping with the gate 23. The transistor T1 having the first channel 27 that is coated with P conductivity type material maintains the OFF state, and the other transistor T2 having the uncoated second channel 29 is not programmed and maintains the ON state.

As illustrated in FIG. 2, a gate oxide layer 17 and a buried oxide layer 19 are formed on a P type semiconductor substrate 11. The buried oxide layer 19 is thicker than the gate oxide layer 17. An impurity region 21 having N type impurity ions is formed under the buried oxide layer 19. The impurity region 21 is the common source/drain of the transistors and used for a bit line. A gate 23, perpendicular to the impurity region 21, is formed on the gate oxide layer 17. A portion of the semiconductor substrate 11, positioned opposite to the gate 23 becomes the first and second channels 27 and 29. The transistor T1 having the first channel 27 is made of the P type impurity ions and maintains the OFF state. The transistor T2 having the second channel 29 maintains the ON state.

A process for forming the above-described conventional mask ROM will now be described with reference to FIGS. 3A–3D.

As illustrated in FIG. 3A, a first photosensitive layer 13 is deposited on the semiconductor substrate 11 made of P type silicon. The photosensitive layer 13 is exposed to light, developed and patterned to expose selected portions of the semiconductor substrate 11. An N type impurity ion such as As or P is heavily doped in the semiconductor substrate 11, using the first photosensitive layer 13 as a mask, to form an ion implanted region 15.

As illustrated in FIG. 3B, the first photosensitive layer 13 is eliminated. The surface of the semiconductor substrate 11 is implanted with impurities during a thermal oxidation process, and the gate oxide layer 17 is formed on a portion where ions are not implanted. The rate of oxidation in the portion of the semiconductor substrate 11 where the ion implanted region 15 is formed is 15 to 20 times faster than that of the portion where ions are not implanted due to a lattice damage, enabling the formation of a thick buried oxide layer 19. During thermal oxidation, impurity ions in the ion implanted region 15 are activated, so that they function as the common source and drain region. The impurity region 21 is used for the bit line.

As illustrated in FIG. 3C, impurity ions such as polycrystal silicon are doped on the gate oxide layer 17 and the buried oxide layer 19 using chemical vapor deposition (CVD). They are patterned to be perpendicular to the impurity region 21 in a photolithography method, effectively forming a gate 23. Therefore, there is formed the transistor whose channel is the portion corresponding to the gate 23 between the impurity regions 21 of the semiconductor substrate 11. The second photosensitive layer 24 is deposited on the overall surface of the substrate, exposed to light, developed and patterned to expose the predetermined transistor. Impurity ions such as B or $BF_2$ are heavily implanted in the substrate to form the ion implanted region 25, using the second photosensitive layer 24 as a mask.

As illustrated in FIG. 3D, the second photosensitive layer 24 is eliminated. The impurity ions in the ion implanted region 25 are heat-treated and diffused to form the first channel 27, where P type impurity ions are heavily doped. The channel where the P type impurity ions are not doped becomes the second channel 29. The transistor T1 that is used for the first channel 27 is coded, and the other transistor T2 that is used for the second channel 29 is not coded.

The above-described conventional mask ROM has a low integration because the impurity region used for the source and drain regions and the gate are formed on the same surface.

SUMMARY OF THE INVENTION

The present invention is directed to a mask ROM that substantially obviates one or more of the problems due to limitations and disadvantages of the related art.

An object of the present invention is to provide a mask ROM which can enhance the integration rate.

Another object of the invention is to provide a mask ROM capable of enhancing integration by forming a channel on the side of a trench.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a mask ROM includes a first conductivity type semiconductor substrate; a trench formed on the semiconductor substrate; a first gate having a first conductivity type channel formed on one side of the trench; a second gate having a second conductivity type channel formed on the other side of the trench; and a second conductivity type impurity region formed on the semiconductor substrate and under the trench.

Alternatively, the mask ROM may include a first conductivity type semiconductor substrate, two gates having different conductivity types, and a second conductivity type impurity region positioned between the semiconductor substrate and the gates. A surface of the substrate includes a trench, the gates being positioned on the sides of the trench, and the second conductivity type impurity region being located at a positioned corresponding to the trench. The first conductivity type semiconductor substrate is P type and the second is N type, the second conductivity type impurity region functioning as at least one of a source and drain region. Additionally, an insulating oxide layer may be positioned on the second conductivity type impurity region.

Further scope of applicability of the present invention will become apparent from the detailed description given hereinafter. However, it should be understood that the detailed description and specific examples, while indicating preferred embodiments of the invention, are given by way of example only, since various changes and modifications within the spirit and scope of the invention will become apparent to those skilled in the art from this detailed description.

BRIEF DESCRIPTION OF THE ATTACHED DRAWINGS

The accompanying drawings, which are included to provide a further understanding of the invention and which are incorporated in and constitute a part of this specification, illustrate embodiments of the invention. Together with the description, the drawings serve to explain the principles of the invention.

DETAILED DESCRIPTION OF PREFERRED EMBODIMENT

Reference will now be made in detail to the preferred embodiments of the present invention, examples of which are illustrated in the accompanying drawings.

Figure 1:
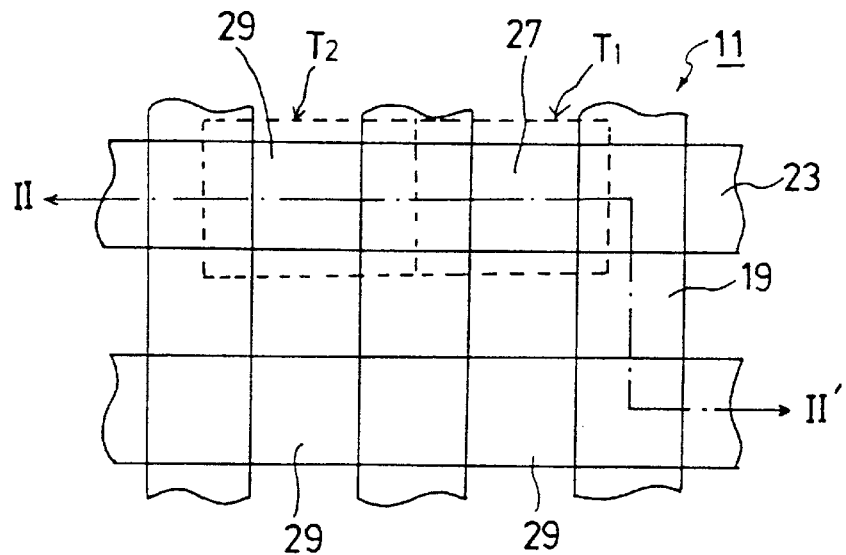
FIG. 1 is a top view of a conventional mask ROM.
Figure 2:
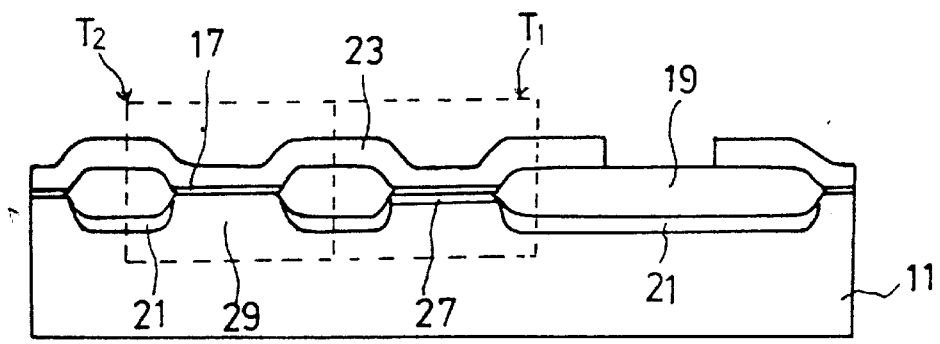
FIG. 2 is a sectional view taken along line II–II' of FIG. 1.
Figure 3A:
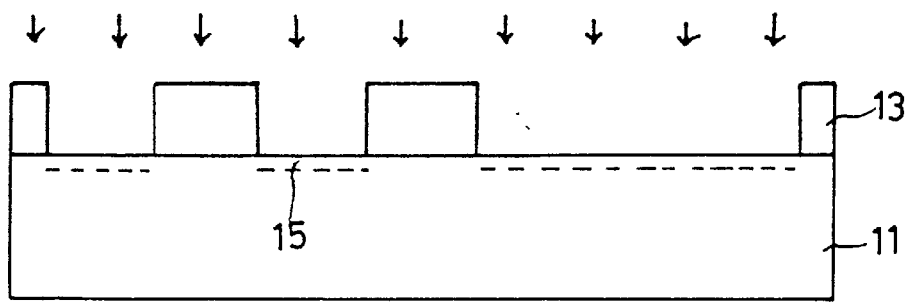
FIGS. 3A to 3D illustrate the fabricational procedures of a conventional mask ROM.
Figure 3B:
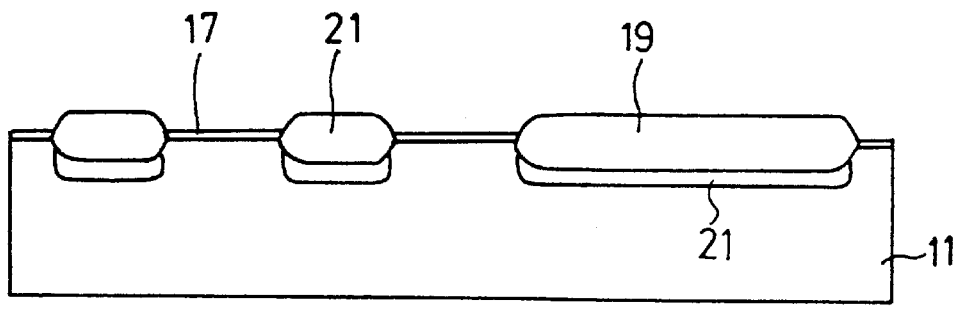
Figure 3C:
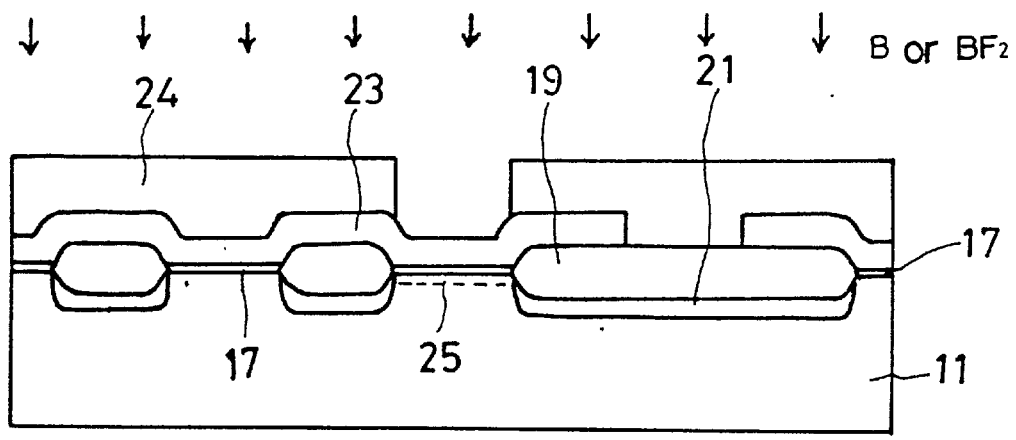
Figure 3D:
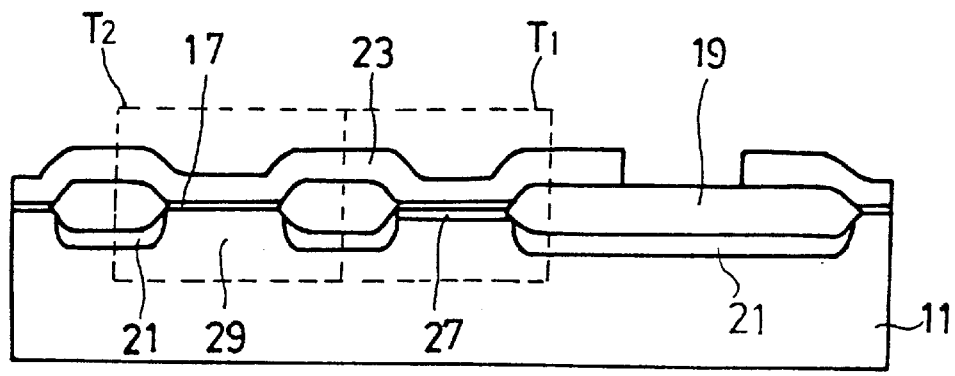
Figure 4:
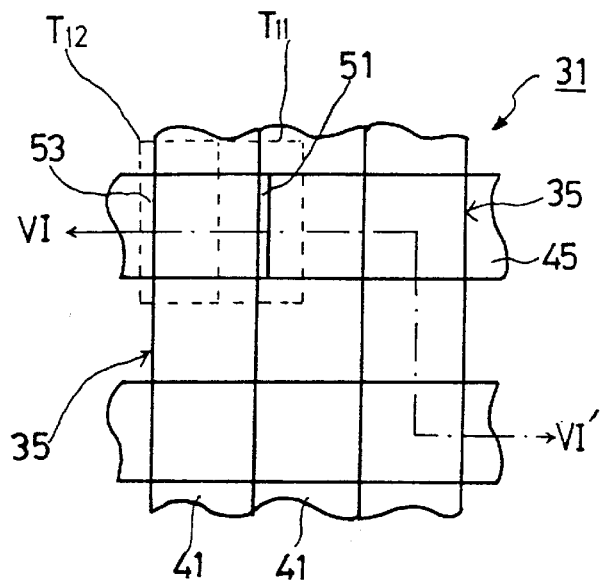
FIG. 4 is a top view of a mask ROM of the invention.

As illustrated in FIG. 4, in a mask ROM of the invention, there is a semiconductor substrate 31 on which a trench 35 is formed. A buried oxide layer 41 is formed on the part where the trench 35 is not formed, and under the bottom surface of the trench 35. A high concentration impurity region (see reference numeral 43 in FIG. 5) made of a common source and drain region and used for a bit line, is formed under the buried oxide layer 41. A word line, functioning as a gate 45, is formed perpendicular to the buried oxide layer 41. In forming the transistors by intersecting the word line 45 with the bit line 43 shown in FIG. 5 below layer 41, one side of the trench 35 overlapping with the gate 45 becomes the first and second channels 51 and 53 of the first and second transistors T11 and T12. The first channel 51 is coded by doping with P type impurity ions, causing it to maintain an OFF state. The second channel 53 is not coded, causing it to maintain an ON state.

Figure 5:
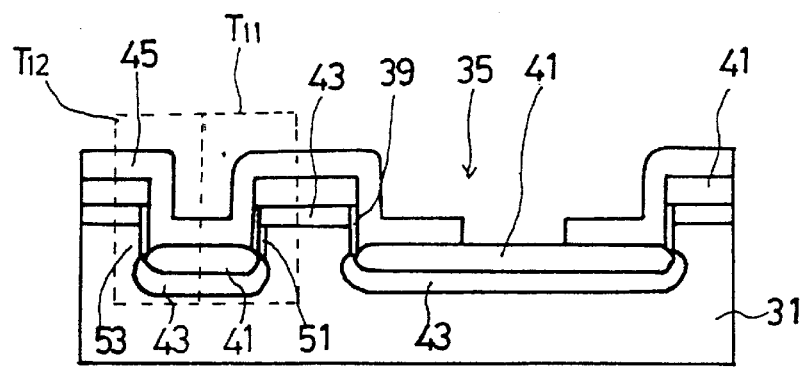
FIG. 5 is a sectional view taken along line VI–VI' of FIG. 4.

As illustrated in FIG. 5, a plurality of trenches 35 are formed on the P type semiconductor substrate 31. Each trench 35 is formed as thick as 0.3 to 1.5 μm. The buried oxide layer 41 is formed on the part of the substrate 31 where the trench 35 is not formed and under the bottom surface of the trench 35. The gate oxide layer 39 is formed on one side of the trench 35. The gate oxide layer 39 is formed as thick as 80–150 Å, and the buried oxide layer 41 is thicker than the gate oxide layer 39 by 15–20 times There is formed an impurity region 43 made of a common source and drain region and used for a bit line under the buried oxide layer 41. In impurity region 43, N type impurity ions are diffused in a high concentration. A gate 45 is positioned perpendicular to the impurity region 43 on the gate oxide layer 39 and the buried oxide layer 41. Therefore, a transistor is formed by the intersection of the word line 45 and the bit line 43, and the side of the trench 35 that overlaps gate 45 becomes the first and second channels 51 and 53 of the first and second transistors T11 and T12. The first channel 51 of the first transistor T11 is doped with P type impurity ions and coded to form an OFF transistor. Because the first and second channels 51 and 53 of the first and second transistors T11 and T12 are formed on the side of the trench 35, perpendicular to the semiconductor substrate 31, the integration rate of the mask ROM is enhanced.

As illustrated in FIGS. 6A to 6E, the fabrication procedures of the mask ROM of the invention are as follows.

Figure 6A:
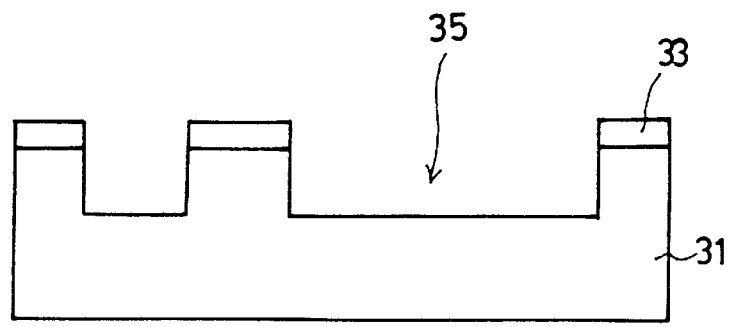
FIGS. 6A to 6E illustrate the fabricational procedures of a mask ROM of the invention.

As illustrated in FIG. 6A, a layer of silicon oxide as thick as 1500 to 3000 Å is doped on the semiconductor substrate 31, made of P type silicon, via a thermal oxidation or CVD process to form a mask layer 33. The mask layer 33 is patterned, by a photo lithography method, to expose a portion of the semiconductor substrate 31. The exposed portion of the semiconductor substrate 31 is deeply etched to form a trench 35 of 0.3–1.5 μm by an anisotropic etching such as a reactive ion etching (RIE).

Figure 6B:
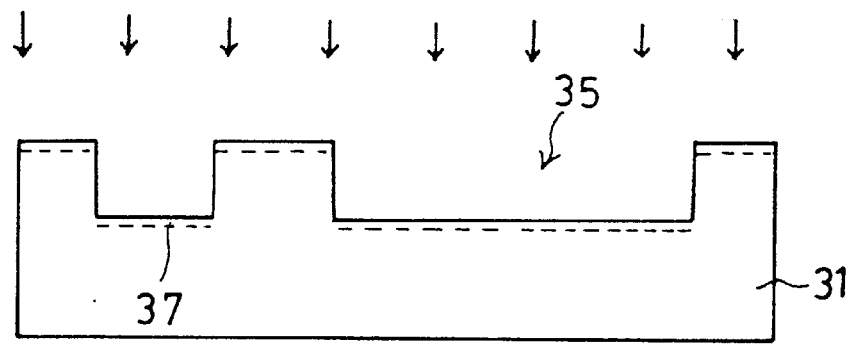

As illustrated in FIG. 6B, the mask layer 33 is eliminated to expose the portion of the semiconductor substrate where the trench 35 is not formed. N type impurity ions, such as As or P, are implanted on the overall surface of the substrate as thick as $1\times10^{15}$ to $1\times10^{16}/cm^2$ at 30 to 80 KeV. As the trench 35 is anisotropically etched, region 37 is formed by implanting impurity ions on the portion where the trench 35 is absent and under the bottom surface of the trench 35. Alternatively, mask layer 33 can be formed after the ion implanted region 37 is formed.

Figure 6C:
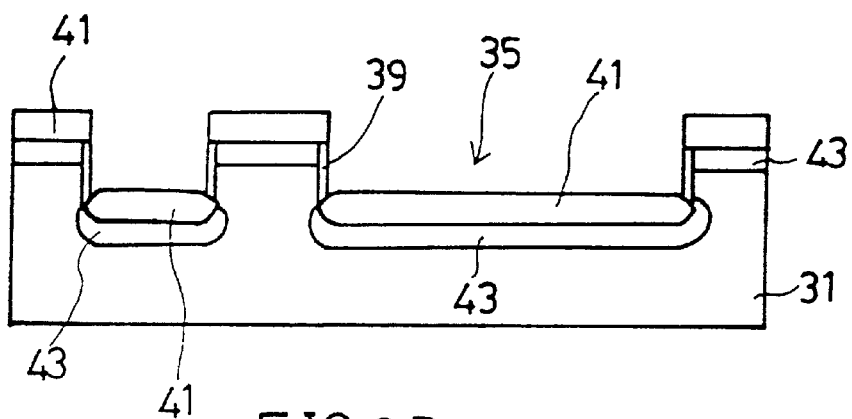

As illustrated in FIG. 6C, the semiconductor substrate 31 is heat-oxidated to form the gate oxide layer 39 and the buried oxide layer 41. The gate oxide layer 39 is formed as thick as 80–150 Å on the side of the trench 35 where the ions are not implanted. The lattice of the surface of the semiconductor substrate 31, which is located where the trench 35 is absent and under the bottom surface of the trench 35, is damaged due to the ion implantation. Therefore, the rate of oxidation in the damaged portion is 15 to 20 times faster than the side of the trench 35 where the ions are not implanted. Thus, the thick buried oxide layer 41 is formed at or above a surface of the trench 35. The impurity ions in the ion implanted region 37 located at and below the surface of substrate 31 are activated by the thermal oxidation during the formation of the gate oxide layer 39 and the buried oxide layer 41. As such, the ion implanted region 37 is used as a basis for forming the impurity region 43 which is used for the source/drain region, under the buried oxide layer 41.

Figure 6D:
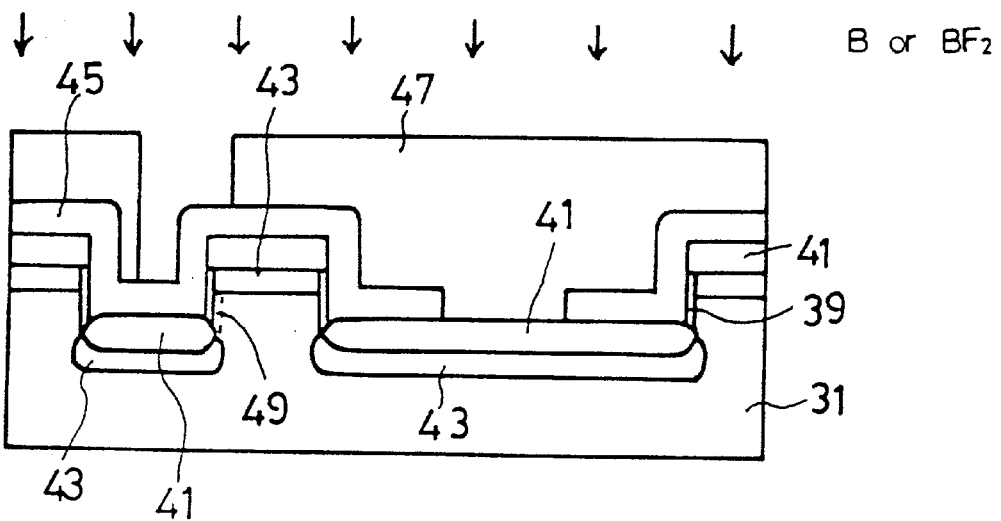

As illustrated in FIG. 6D, where impurity ions are doped, polycrystal silicon is deposited on the gate oxide layer 39 and buried oxide layer 41 as thick as 1500–2500 Å. After deposition, the polycrystal silicon is patterned to intersect with the impurity region 43 via the photo lithography method, causing gate 45 to be formed. Therefore, transistors are formed having channels that correspond to the gate 45 between the impurity regions 43 of the semiconductor substrate 11. The second photosensitive layer 47 is deposited on the overall surface of the substrate, exposed to light, developed and patterned to expose the predetermined transistor. Impurity ions such as B or $BF_2$ are heavily implanted in the substrate by a dose of $5\times10^{13}$ to $5\times10^{14}/cm^2$ at 240 to 300 KeV to form the ion implanted region 49, using the second photosensitive layer 47 as a mask. The ion implanted region 49 is formed in only one side of the trench 35 used for the transistor channel.

Figure 6E:
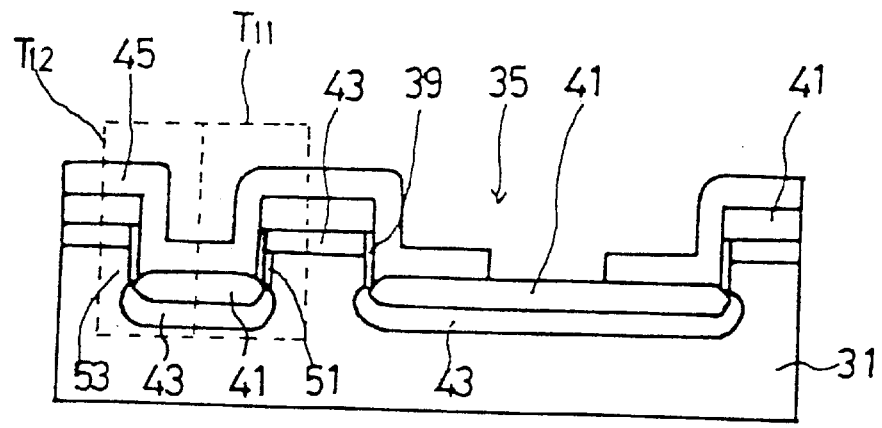

As illustrated in FIG. 6E, the second photosensitive layer 47 is eliminated. The impurity ions in the ion implanted region 49 are heat-treated and diffused to form the first channel 51, where P type impurity ions are heavily doped. The side of the trench 35, where the P type impurity ions are not doped, becomes the second channel 53. The transistor T11 used for the first channel 51 is coded, and the other transistor T12 used for the second channel 53 is not coded.

Figure 7A:
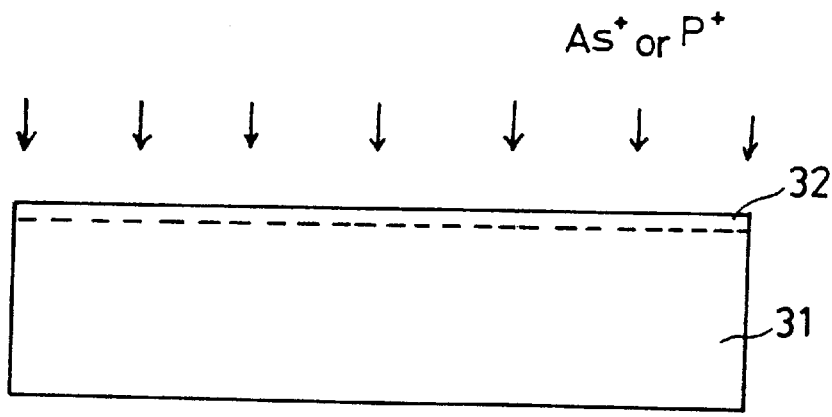
FIGS. 7A and 7B illustrate the fabricational procedures of a mask ROM according to another embodiment of the invention.
Figure 7B:
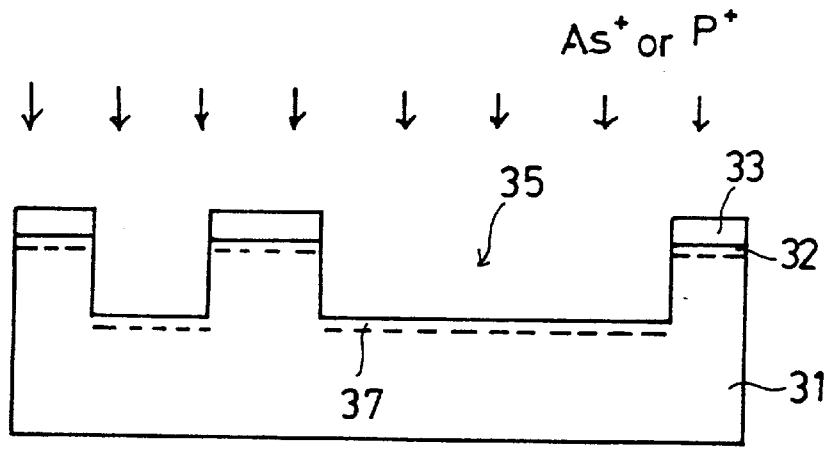

FIGS. 7A and 7B illustrate the fabrication procedures of a mask ROM according to another embodiment of this invention.

As illustrated in FIG. 7A, N type impurity ions such as As or P may be implanted as thick as $1\times10^{15}$ to $1\times10^{16}/cm^2$ at 30 to 80 KeV to form an ion implanted region 32.

As illustrated in FIG. 7B, a layer of oxide silicon as thick as 1500–3000 Å is deposited on the semiconductor substrate 31 via a CVD or thermal oxidation process to form the mask layer 33. The mask layer 33 is patterned by a photo lithography method to expose a predetermined portion of the substrate. The exposed portion of the semiconductor substrate 31 is deeply etched to form trench 35 of 0.3–1.5 $\mu$m by an anisotropic etching such as RIE. N type impurity ions, such as As or P, are implanted as thick as $1\times10^{15}$ to $1\times10^{16}/cm^2$ at 30 to 80 KeV to form the ion implanted region 37.

Then the mask layer 33 is eliminated to expose the portion of the substrate 31 where the trench 35 is not formed, after which time the processes of FIGS. 6C–6E are performed. Specifically, the impurity ions in the ion implanted regions 32 and 37 are activated in the formation of the gate oxide layer 39 and the buried oxide layer 41 in the process of FIG. 6C, so that the impurity region 43 used for the source drain region is formed under the buried oxide layer 41.

In the above-mentioned method according to the embodiment of the invention, N type transistor is formed on the P type semiconductor substrate, and P type transistor can be formed on the N type semiconductor substrate.

Therefore, the invention has the effect that the channel of the transistor is formed on one side of the trench, perpendicular to the surface of the substrate, thereby enhancing the integration.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a continuation or divisional application.

What is claimed is:

1. A method of fabricating a mask ROM, comprising:
   forming a trench at a surface of a semiconductor substrate of a first conductivity type;
   implanting an impurity ion of a second conductivity type in the surface of the semiconductor substrate including a bottom surface of the trench;
   simultaneously forming an impurity region of the second conductivity type and an insulating layer at the surface of the semiconductor substrate including the bottom surface of the trench, wherein the insulating layer is formed on the impurity region, and forming gate oxide layers simultaneously with the impurity region and the insulating layer, the gate oxide layers being formed at an exposed surface of the semiconductor substrate where the impurity ion is not implanted;
   forming first and second gates on the gate oxide layers; and
   forming a channel of a first conductivity type by implanting an impurity ion of a first conductivity type in one side of the trench.

2. The method as recited by claim 1, wherein the first conductivity type semiconductor substrate is P type and the second conductivity type is N type.

3. The method as recited by claim 1, wherein a first conductivity type impurity region is formed under the insulating layer while the insulating oxide layer is being formed on the semiconductor substrate and under the bottom surface of the trench and while forming the gate oxide layers on both sides of the trench, respectively.

4. The method as recited by claim 1, wherein the process of forming the trench comprises:
   forming a mask layer on the semiconductor substrate;
   patterning the mask layer in the shape of a stripe for exposing a portion of the semiconductor substrate; and
   etching the exposed portion of the semiconductor substrate.

5. The method as recited by claim 4, wherein the mask layer is formed of a silicon oxide.

6. The method as recited by claim 4, wherein the trench is formed by anisotropic etching the semiconductor substrate.

7. The method as recited by claim 1, wherein the step of forming the channel is performed before the step of forming the first and second gates.

8. The method as recited by claim 1, further comprising:

implanting an impurity ion of a second conductivity type in an overall surface of the semiconductor substrate before the trench is formed.

9. The method as recited by claim 4, further comprising implanting an impurity ion of a second conductivity type in an overall surface of the semiconductor substrate before forming the mask layer on the semiconductor substrate.

10. The method recited by claim 1, wherein the simultaneously forming includes:

forming the insulating layer and gate oxide layers by thermal oxidation of the trench.

11. A method of fabricating a mask ROM, comprising:

forming a trench at a surface portion of a semiconductor substrate, the trench having a bottom surface and side surfaces;

implanting an impurity ion in the surface portion of the semiconductor substrate including the bottom surface of the trench;

simultaneously forming an impurity layer, a buried oxide layer and a first gate oxide layer;

forming a gate on the first gate oxide layer; and forming a channel of a first conductivity type by implanting an impurity ion in one side of the trench, where the impurity ion implanted in the surface portion of the semiconductor substrate is a second conductivity type.

12. The method recited by claim 11, wherein the impurity layer and buried oxide layer are formed on the bottom surface of the trench, the impurity layer being positioned under the buried oxide layer.

13. The method recited by claim 12, wherein the first gate oxide layer is formed on at least a first one of the side surfaces of the trench.

14. The method recited by claim 11, further comprising:

forming a second gate oxide layer on a side surface of the trench that is different from the side surface upon which the first gate oxide film is formed, the second gate oxide layer being formed simultaneously with the first gate oxide layer.

15. The method recited by claim 11, wherein the semiconductor substrate has the first conductivity type, the impurity ions implanted in a surface of the semiconductor substrate have the second conductivity type such that the impurity layer is formed with the second conductivity type, and the impurity ions implanted in the one side of the trench have the first conductivity type such that the channel has the first conductivity type.

16. The method recited by claim 11, wherein heat oxidation is used to simultaneously form the impurity layer, the buried oxide layer and the gate oxide layer.

17. The method recited by claim 10, wherein the simultaneously forming further includes:

forming the impurity region using ions that are activated during the thermal oxidation used to form the insulating layer and gate oxide layers.

18. The method recited by claim 11, wherein the simultaneously forming includes:

forming the buried oxide layer and the first gate oxide layer by thermal oxidation of the trench.

19. The method recited by claim 18, wherein the simultaneously forming further includes:

forming the impurity layer using ions that are activated during the thermal oxidation used to form the buried oxide layer and the first gate oxide layer.

* * * * *